United States Patent
Tabata

(10) Patent No.: US 11,124,675 B2
(45) Date of Patent: Sep. 21, 2021

(54) METHOD OF POLISHING SUBSTRATE AND POLISHING COMPOSITION SET

(71) Applicant: FUJIMI INCORPORATED, Kiyosu (JP)

(72) Inventor: Makoto Tabata, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 16/630,605

(22) PCT Filed: Jul. 18, 2018

(86) PCT No.: PCT/JP2018/026976
§ 371 (c)(1),
(2) Date: Jan. 13, 2020

(87) PCT Pub. No.: WO2019/017407
PCT Pub. Date: Jan. 24, 2019

(65) Prior Publication Data
US 2020/0181453 A1  Jun. 11, 2020

(30) Foreign Application Priority Data

Jul. 21, 2017 (JP) .............................. JP2017-141762

(51) Int. Cl.
| | | |
|---|---|---|
| C09G 1/02 | (2006.01) | |
| C09G 1/00 | (2006.01) | |
| B24B 1/00 | (2006.01) | |
| C09G 1/06 | (2006.01) | |
| C09K 3/14 | (2006.01) | |
| C09K 13/06 | (2006.01) | |
| C09G 1/04 | (2006.01) | |
| H01L 21/321 | (2006.01) | |
| H01L 21/306 | (2006.01) | |
| B24B 37/04 | (2012.01) | |
| H01L 21/304 | (2006.01) | |

(52) U.S. Cl.
CPC .................. *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/06* (2013.01); *H01L 21/30625* (2013.01); *H01L 21/3212* (2013.01); *H01L 21/304* (2013.01)

(58) Field of Classification Search
None
See application file for complete search history.

(56) References Cited

U.S. PATENT DOCUMENTS

| | | | |
|---|---|---|---|
| 2010/0009155 A1 | 1/2010 | Hashii et al. | |
| 2013/0032573 A1* | 2/2013 | Ogata | ..................... B24B 37/08 216/53 |
| 2013/0095660 A1 | 4/2013 | Tanimoto et al. | |
| 2014/0141613 A1 | 5/2014 | Heilmaier et al. | |
| 2015/0166838 A1 | 6/2015 | Tsuchiya et al. | |

FOREIGN PATENT DOCUMENTS

| | | |
|---|---|---|
| JP | 2001-239452 A | 9/2001 |
| JP | 2003-257906 A | 9/2003 |
| JP | 2010-021487 A | 1/2010 |
| JP | 2014-103398 A | 6/2014 |
| JP | 2015-185672 A | 10/2015 |
| WO | WO-2012/002525 A1 | 1/2012 |

OTHER PUBLICATIONS

English translation of the International Preliminary Report on Patentability issued in corresponding PCT Application No. PCT/JP2018/026976 dated Jan. 30, 2020.
International Search Report with English translation and Written Opinion issued in corresponding application No. PCT/JP2018/026976 dated Oct. 2, 2018.
Extended European search report issued in corresponding European Application No. 18834922.9 dated Apr. 7, 2021.

* cited by examiner

*Primary Examiner* — Jiong-Ping Lu
(74) *Attorney, Agent, or Firm* — Foley & Lardner LLP

(57) ABSTRACT

A substrate polishing method includes a stock polishing step comprising a plurality of stock polishing sub-steps in which a first polishing solution, a second polishing solution, and a third polishing solution are applied, in that order, to a substrate. A content $COM_{P1}$ of water-soluble polymer $P_1$ in the first polishing solution, a content $COM_{P2}$ of water-soluble polymer $P_2$ in the second polishing solution, and a content $COM_{P3}$ of water-soluble polymer $P_3$ in the third polishing solution satisfy $COM_{P1} < COM_{P2} < COM_{P3}$, and any one of the following conditions is satisfied: (1) average primary particle diameter $D_{A3}$ of abrasive $A_3$ in the third polishing solution is smaller than average primary particle diameter $D_{A1}$ of abrasive $A_1$ in the first polishing solution and average primary particle diameter $D_{A2}$ of abrasive $A_2$ in the second polishing solution; and (2) the third polishing solution does not contain abrasive $A_3$.

3 Claims, No Drawings

METHOD OF POLISHING SUBSTRATE AND POLISHING COMPOSITION SET

TECHNICAL FIELD

The present invention relates to a method of polishing a substrate and a polishing composition set used for polishing a substrate. Priority is claimed on Japanese Patent Application No. 2017-141762, filed Jul. 21, 2017, the content of which is incorporated herein by reference.

BACKGROUND ART

Generally, a surface of a substrate used for producing a semiconductor product and the like is finished to a high-quality mirror surface through a lapping step (rough polishing step) and a polishing step (fine polishing step). The polishing step typically includes a stock polishing step and a final polishing step. Examples of technical literature related to polishing of a semiconductor substrate such as a silicon wafer include Patent Documents 1 to 3.

CITATION LIST

Patent Literature

[Patent Document 1] Japanese Patent Application Publication No. 2003-257906
[Patent Document 2] Japanese Patent Application Publication No. 2014-103398
[Patent Document 3] Japanese Patent Application Publication No. 2001-239452

SUMMARY OF INVENTION

Technical Problem

In recent years, a higher quality surface with better flatness and fewer defects has been required for semiconductor substrates such as a silicon wafer and other substrates. Therefore, even in a stock polishing step performed as a step before a final polishing step, higher flatness and fewer surface defects after polishing are required. In this regard, in order to improve flatness and reduce surface defects of the substrate after polishing, incorporation of a water-soluble polymer into a stock polishing composition has been studied. However, when the water-soluble polymer is incorporated into the stock polishing composition, flatness is improved and surface defects are reduced after polishing, but the polishing removal rate is reduced, and thus there is a problem of a time required for the polishing step (polishing removal time) being prolonged. A polishing method in which a surface with high flatness and few defects can be realized with high efficiency after polishing is required.

Here, an object of the present invention is to provide a method of polishing a substrate in which a surface with high flatness and few defects can be realized with high efficiency. Another related object is to provide a polishing composition set that can be suitably used in such a polishing method.

Solution to Problem

In this specification, a method of polishing a substrate is provided. The method includes a stock polishing step of preliminarily polishing the substrate. The stock polishing step includes a plurality of stock polishing sub-steps that are performed on a same polishing platen. The plurality of stock polishing sub-steps include a first stock polishing sub-step that is performed by supplying a first polishing solution, a second stock polishing sub-step that is performed by supplying a second polishing solution, and a third stock polishing sub-step that is performed by supplying a third polishing solution, to the substrate, in this order. The relationships between a content $COM_{P1}$ of a water-soluble polymer $P_1$ contained in the first polishing solution, a content $COM_{P2}$ of a water-soluble polymer $P_2$ contained in the second polishing solution, and a content $COM_{P3}$ of a water-soluble polymer $P_3$ contained in the third polishing solution satisfy $COM_{P1} < COM_{P2} < COM_{P3}$ and any one of the following conditions is satisfied: (1) the average primary particle diameter $D_{A3}$ of abrasive $A_3$ contained in the third polishing solution is smaller than the average primary particle diameter $D_{A1}$ of abrasive $A_1$ contained in the first polishing solution and the average primary particle diameter $D_{A2}$ of abrasive $A_2$ contained in the second polishing solution; and (2) the third polishing solution does not contain abrasive $A_3$. According to the polishing method, a surface with high flatness and few defects after polishing can be realized with high efficiency.

In a preferable aspect of the polishing method disclosed here, the first polishing solution does not contain the water-soluble polymer $P_1$. When the first polishing solution is used, the polishing method disclosed here can be preferably performed.

The polishing method disclosed here can be used in a stock polishing step for various substrates. In particular, it can be preferably used in a stock polishing step for a silicon substrate. It is particularly suitable as a polishing method that is used for preliminarily polishing a silicon wafer.

In a preferable aspect of the polishing method disclosed here, the second polishing solution is a mixture containing the first polishing solution and the third polishing solution. The second stock polishing sub-step is performed by simultaneously supplying the first polishing solution and the third polishing solution to the substrate. In this manner, when the first polishing solution and the third polishing solution are simultaneously supplied and the second stock polishing sub-step is performed, the polishing method disclosed here can be performed more simply and effectively.

According to the present invention, there is also provided a polishing composition set that is used in the polishing method according to any of the methods disclosed here. The polishing composition set includes a first stock polishing composition that is the first polishing solution or a concentrated liquid thereof; and a third stock polishing composition that is the third polishing solution or a concentrated liquid thereof. The first stock polishing composition and the third stock polishing composition are stored separately from each other.

In one aspect, the polishing composition set further includes a second stock polishing composition that is the second polishing solution or a concentrated liquid thereof. The second stock polishing composition is stored separately from the first stock polishing composition and the third stock polishing composition.

The polishing method disclosed here can be suitably performed using the polishing composition set having such a configuration.

DESCRIPTION OF EMBODIMENTS

Preferable embodiments of the present invention will be described below. Here, components other than those particularly mentioned in this specification that are necessary for implementation of the present invention can be recognized by those skilled in the art as design matters based on the related art in the field. The present invention can be implemented based on content disclosed in this specification and common general technical knowledge in the field.

The technology disclosed here is preferably applied for polishing various substrates as polishing objects. Examples of the material of the polishing object include metals or metalloids such as silicon, aluminum, nickel, tungsten, copper, tantalum, titanium, and stainless steel, and alloys thereof; glassy materials such as quartz glass, aluminosilicate glass, and glassy carbon; ceramic materials such as alumina, silica, sapphire, silicon nitride, tantalum nitride, and titanium carbide; compound semiconductor substrate materials such as silicon carbide, gallium nitride, and gallium arsenide; and resin materials such as a polyimide resin. A substrate made of a plurality of materials among these may be used.

The polishing method disclosed here can be particularly preferably used for polishing a silicon substrate having a surface made of silicon, typically, polishing a silicon wafer. A typical example of the silicon wafer here is a silicon single crystal wafer, for example, a silicon single crystal wafer obtained by slicing a silicon single crystal ingot. A surface to be polished in the technology disclosed here is typically a surface made of silicon.

The silicon substrate may be subjected to a general treatment that can be applied to the silicon substrate in a process upstream from a stock polishing step such as lapping and etching before the stock polishing step disclosed here.

Here, in the following description, regardless of in which stock polishing sub-step a polishing solution is used, the term "stock polishing solution" may be used as a term comprehensively indicating a polishing solution to be used in the stock polishing step. That is, the stock polishing solution is a term that comprehensively indicates a first polishing solution, second polishing solution and third polishing solution to be described below. Similarly, regardless of a polishing solution used in any polishing step, the term "polishing solution" may be used as a term that comprehensively indicates the polishing solution used in the polishing step. That is, the "polishing solution" is a term that comprehensively indicates a polishing solution used in the stock polishing step and a polishing solution used in the final polishing step.

<Stock Polishing Solution>

The stock polishing step in the polishing method disclosed here is performed in a mode in which a first stock polishing sub-step in which a polishing target substrate is polished with a first polishing solution, a second stock polishing sub-step in which the polishing object is polished with a second polishing solution, and a third stock polishing sub-step in which the polishing object is polished with a third polishing solution are performed on a same platen in this order. That is, the first stock polishing sub-step, the second stock polishing sub-step, and the third stock polishing sub-step are performed without moving the polishing object to another polishing machine or another platen while performing these sub-steps. The first stock polishing sub-step, the second stock polishing sub-step, and the third stock polishing sub-step are performed step by step on a same polishing object. However, in the stock polishing sub-steps, simultaneous polishing of a plurality of polishing objects in parallel, that is, performing batch polishing, is not prevented.

The stock polishing solution used in each stock polishing sub-step may typically include abrasive, a water-soluble polymer and water. Specifically, the first polishing solution used in the first stock polishing sub-step may include abrasive $A_1$, a water-soluble polymer $P_1$ and water. The second polishing solution used in the second stock polishing sub-step may include abrasive $A_2$, a water-soluble polymer $P_2$ and water. The third polishing solution used in the third stock polishing sub-step may include abrasive $A_3$, a water-soluble polymer $P_3$ and water.

The technology disclosed here is performed, in the stock polishing step, when the relationships between the content $COM_{P1}$ of the water-soluble polymer $P_1$ contained in the first polishing solution, the content $COM_{P2}$ of the water-soluble polymer $P_2$ contained in the second polishing solution, and the content $COM_{P3}$ of the water-soluble polymer $P_3$ contained in the third polishing solution satisfy $COM_{P1}<COM_{P2}<COM_{P3}$, and any one of the following conditions is satisfied:

(1) The average primary particle diameter $D_{A3}$ of abrasive $A_3$ contained in the third polishing solution is smaller than the average primary particle diameter $D_{A1}$ of abrasive $A_1$ contained in the first polishing solution and the average primary particle diameter $D_{A2}$ of abrasive $A_2$ contained in the second polishing solution; and (2) the third polishing solution does not contain abrasive $A_3$.

According to such an aspect, a surface with high flatness and few defects after polishing can be realized with high efficiency.

The reason why such an effect is exhibited is speculated, for example, to be as follows. That is, the water-soluble polymer exhibits a substrate surface protecting effect during polishing. Therefore, the flatness after polishing can be increased or surface defects can be reduced using the stock polishing solution containing the water-soluble polymer, but the polishing removal rate is likely to decrease. In addition, since abrasive with a large diameter have a higher mechanical removal ability than abrasive with a small diameter, the surface of the substrate is efficiently ground using the abrasive with a large diameter, and on the other hand, the surface flatness after polishing tends to decrease and surface defects tend to increase. In the technology disclosed here, during polishing in the stock polishing step, the stock polishing solution supplied to a polishing object is sequentially switched from the first polishing solution to the second polishing solution and the third polishing solution. Since the first polishing solution has a small content of the water-soluble polymer and contains abrasive with a large diameter, greatly grinding the surface of the substrate contributes to shortening a polishing time. Since the second polishing solution has a larger content of the water-soluble polymer than the first polishing solution and contains abrasive with a large diameter, the surface which is greatly ground due to polishing with the first polishing solution is appropriately ground and the shape is adjusted and thus it contributes to improving the surface flatness. Since the third polishing solution contains a larger content of the water-soluble polymer than the second polishing solution and contains abrasive with a small diameter or does not contain abrasive, the water-soluble polymer is appropriately adsorbed to the surface of which the shape is adjusted due to polishing of the second polishing solution, and the surface is protected, and thus it contributes to reducing surface defects. Therefore, it is thought that, when the first polishing solution, the second polishing solution, and the third polishing solution that satisfy the relationship are supplied in this order, in the stock polishing step, improvement in surface flatness and reduction in surface defects are achieved in a shorter polishing removal time. In addition, when these stock polishing solutions are supplied to a same platen in a switching manner, it is possible to avoid complicated operations and complicated facilities, and the stock polishing step using the stock polishing solutions of a plurality of types can be performed with high efficiency. Hereinafter, the configuration of the stock polishing solutions will be described in more detail.

(Water-Soluble Polymer)

The stock polishing solutions may contain a water-soluble polymer. The type of the water-soluble polymer contained in the stock polishing solutions disclosed here is not limited, and the water-soluble polymer can be appropriately selected from among water-soluble polymers known in the field of polishing solutions. Water-soluble polymers can be used alone or two or more thereof can be used in combination.

The water-soluble polymer may have at least one functional group selected from among a cationic group, an anionic group and a nonionic group in a molecule. The water-soluble polymer may have, for example, a hydroxyl group, a carboxy group, an acyloxy group, a sulfo group, a primary amide structure, a heterocyclic structure, a vinyl structure, a polyoxyalkylene structure, or the like in a molecule. In order to reduce aggregates and improve cleanability, a nonionic polymer can be preferably used as the water-soluble polymer.

Examples of water-soluble polymers include cellulose derivatives, starch derivatives, polymers containing oxyalkylene units, polymers containing nitrogen atoms, and polyvinyl alcohols. Among these, cellulose derivatives, polymers containing nitrogen atoms, or polyvinyl alcohols are preferable, and cellulose derivatives are more preferable. When such a water-soluble polymer is used, it is possible to improve surface flatness and reduce surface defects after polishing.

Cellulose derivatives are polymers including β-glucose units as main repeating units. Specific examples of cellulose derivatives include hydroxyethylcellulose (HEC), hydroxypropylcellulose, hydroxyethylmethylcellulose, hydroxypropylmethylcellulose, methylcellulose, ethylcellulose, ethyl hydroxyethyl cellulose, and carboxymethylcellulose. Among these, HEC is preferable.

Starch derivatives are polymers including α-glucose units as a main repeating unit. Specific examples of starch derivatives include pregelatinized starch, pullulan, carboxymethyl starch, and cyclodextrin. Among these, pullulan is preferable.

Examples of polymers containing oxyalkylene units include a block copolymer of polyethylene oxide (PEO) and ethylene oxide (EO), propylene oxide (PO) or butylene oxide (BO) and a random copolymer of EO and PO or BO. Among these, a block copolymer of EO and PO or a random copolymer of EO and PO is preferable. The block copolymer of EO and PO may be a diblock copolymer, a triblock copolymer, and the like which include a PEO block and a polypropylene oxide (PPO) block. Examples of triblock copolymers include a PEO-PPO-PEO type triblock copolymer and a PPO-PEO-PPO type triblock copolymer. Generally, a PEO-PPO-PEO type triblock copolymer is more preferable.

In the block copolymer or random copolymer of EO and PO, a molar ratio (EO/PO) between EO and PO constituting the copolymer is preferably larger than 1, more preferably 2 or more, and most preferably 3 or more, for example, 5 or more, in consideration of solubility in water, cleanability, and the like.

Regarding polymers containing nitrogen atoms, any of a polymer containing nitrogen atoms in the main chain and a polymer containing nitrogen atoms in a side chain functional group (pendant group) can be used. Examples of polymers containing nitrogen atoms in the main chain include homopolymers and copolymers of N-acylalkylenimine type monomers. Specific examples of N-acylalkylenimine type monomers include N-acetylethyleneimine and N-propionylethyleneimine. Examples of polymers containing nitrogen atoms in a pendant group include polymers containing N-vinyl type monomer units. For example, at least one of homopolymers and copolymers of N-vinylpyrrolidone obtained by polymerizing N-vinylpyrrolidone in a proportion of 50 mol % or more (hereinafter referred to as "PVP") is preferably used.

When polyvinyl alcohol (PVA) is used as the water-soluble polymer, the degree of saponification of the polyvinyl alcohol is not particularly limited. In one aspect, a polyvinyl alcohol having a degree of saponification of 90 mol % or more, and typically 95 mol % or more, for example, 98 mol % or more, can be used.

In the technology disclosed here, the molecular weight of the water-soluble polymer is not particularly limited. The weight average molecular weight (Mw) of the water-soluble polymer can be, for example, $200 \times 10^4$ or less, and in consideration of dispersion stability and the like, is generally $180 \times 10^4$ or less, and typically $150 \times 10^4$ or less is appropriate. In addition, in order to improve surface protection of a polished object after polishing, generally, the Mw is appropriately $0.5 \times 10^4$ or more, more preferably $0.8 \times 10^4$ or more, and most preferably $1 \times 10^4$ or more.

When cellulose derivatives are used as the water-soluble polymer, the Mw is appropriately about $50 \times 10^4$ or more, preferably $80 \times 10^4$ or more, and more preferably $100 \times 10^4$ or more. In addition, the Mw is, for example, $200 \times 10^4$ or less, preferably $180 \times 10^4$ or less. When a polymer containing nitrogen atoms is used as the water-soluble polymer, the Mw is appropriately about $1 \times 10^4$ or more, preferably $2 \times 10^4$ or more, more preferably $3 \times 10^4$ or more, and most preferably $4 \times 10^4$ or more. In addition, the Mw is preferably $20 \times 10^4$ or less, more preferably $10 \times 10^4$ or less, and most preferably $6 \times 10^4$ or less. When a polyvinyl alcohol is used as the water-soluble polymer, the Mw is appropriately about $0.5 \times 10^4$ or more, preferably $0.8 \times 10^4$ or more, and more preferably $1 \times 10^4$ or more. In addition, the Mw is preferably $5 \times 10^4$ or less, more preferably $3 \times 10^4$ or less, and most preferably $2 \times 10^4$ or less.

The relationship between the weight average molecular weight (Mw) and the number average molecular weight (Mn) of the water-soluble polymer is not particularly limited. In order to prevent the occurrence of aggregates, for example, the molecular weight distribution (Mw/Mn) is preferably 10.0 or less and more preferably 7.0 or less.

Here, regarding Mw and Mn of the water-soluble polymer, values (aqueous, in terms of polyethylene oxide) based on aqueous gel permeation chromatography (GPC) can be used.

As described above, the technology disclosed here is performed in a mode in which the relationships between the content $COM_{P1}$ of the water-soluble polymer $P_1$ contained in the first polishing solution, the content $COM_{P2}$ of the water-soluble polymer $P_2$ contained in the second polishing solution, and the content $COM_{P3}$ of the water-soluble polymer $P_3$ contained in the third polishing solution satisfy $COM_{P1} < COM_{P2} < COM_{P3}$.

The content $COM_{P1}$ of the water-soluble polymer $P_1$ contained in the first polishing solution is not particularly limited as long as it is smaller than the content $COM_{P2}$ of the water-soluble polymer $P_2$ contained in the second polishing solution. $COM_{P1}$ may be typically 0.1% by weight or less.

In consideration of polishing removal rate and the like, $COM_{P1}$ is preferably 0.01% by weight or less, more preferably 0.005% by weight or less, still more preferably 0.001% by weight or less, and particularly preferably 0.0001% by weight or less. $COM_{P1}$ may be, for example, less than 0.00001% by weight, and typically 0.000005% by weight or less. The technology disclosed here can also be performed in a mode in which the first polishing solution does not substantially contain the water-soluble polymer $P_1$.

The content $COM_{P2}$ of the water-soluble polymer $P_2$ contained in the second polishing solution is not particularly limited as long as it is larger than $COM_{P1}$ and smaller than the content $COM_{P3}$ of the water-soluble polymer $P_3$ contained in the third polishing solution. $COM_{P2}$ may be typically 0.00001% by weight or more. In order to easily obtain a surface with higher flatness and the like, $COM_{P2}$ is preferably 0.00005% by weight or more, more preferably 0.0001% by weight or more, and most preferably 0.0003% by weight or more. In addition, $COM_{P2}$ may be typically 1% by weight or less. In order to shorten a polishing removal time and the like, $COM_{P2}$ is preferably 0.5% by weight or less, more preferably 0.1% by weight or less, still more preferably 0.005% by weight or less, and particularly preferably 0.003% by weight or less. The technology disclosed here can be preferably performed in a mode in which $COM_{P2}$ of the water-soluble polymer $P_2$ contained in the second polishing solution is 0.0003% by weight or more and 0.002% by weight or less.

In one aspect of the technology disclosed here, a value obtained by subtracting $COM_{P1}$ of the water-soluble polymer $P_1$ from $COM_{P2}$ of the water-soluble polymer $P_2$ is preferably 0.00005% by weight or more, more preferably 0.0001% by weight or more, and most preferably 0.0003% by weight or more. In addition, a value obtained by subtracting $COM_{P1}$ of the water-soluble polymer $P_1$ from $COM_{P2}$ of the water-soluble polymer $P_2$ is preferably 0.5% by weight or less, more preferably 0.1% by weight or less, still more preferably 0.005% by weight or less, and particularly preferably 0.003% by weight or less. In such an aspect, both improvement in polishing removal rate and improvement in surface flatness can be suitably achieved.

The content $COM_{P3}$ of the water-soluble polymer $P_3$ contained in the third polishing solution is not particularly limited as long as it is larger than $COM_{P2}$. $COM_{P3}$ may be typically 0.0001% by weight or more. In order to obtain a surface with higher quality and the like, $COM_{P3}$ is preferably 0.0005% by weight or more, more preferably 0.001% by weight or more, and most preferably 0.003% by weight or more. In addition, $COM_{P3}$ may be typically 3% by weight or less. In order to shorten a polishing removal time and the like, $COM_{P3}$ is preferably 1% by weight or less, more preferably 0.5% by weight or less, still more preferably 0.05% by weight or less, and particularly preferably 0.03% by weight or less. The technology disclosed here can be preferably performed in a mode in which $COM_{P3}$ of the water-soluble polymer $P_3$ contained in the third polishing solution is 0.003% by weight or more and 0.02% by weight or less.

A ratio of $COM_{P3}$ of the water-soluble polymer $P_3$ to $COM_{P2}$ of the water-soluble polymer $P_2$, that is, a ratio of $COM_{P3}$ with respect to $COM_{P2}$ ($COM_{P3}/COM_{P2}$) is not particularly limited as long as it is larger than 1. The ratio is generally appropriately 2 or more, preferably 3 or more, more preferably 5 or more, and most preferably 8 or more. In addition, the ratio is generally appropriately 40 or less, preferably 30 or less, and more preferably 25 or less. The technology disclosed here can be preferably performed in a mode in which the ratio is 5 or more and 25 or less. When the ratio is not too large and not too small, both improvement in surface flatness and reduction in surface defects can be suitably achieved.

In one aspect of the technology disclosed here, a value obtained by subtracting $COM_{P2}$ of the water-soluble polymer $P_2$ from $COM_{P3}$ of the water-soluble polymer $P_3$ is preferably 0.0005% by weight or more, more preferably 0.001% by weight or more, and most preferably 0.003% by weight or more. In addition, a value obtained by subtracting $COM_{P2}$ of the water-soluble polymer $P_2$ from $COM_{P3}$ of the water-soluble polymer $P_3$ is preferably 0.5% by weight or less, more preferably 0.1% by weight or less, still more preferably 0.05% by weight or less, and particularly preferably 0.03% by weight or less. In such an aspect, both improvement in surface flatness and reduction in surface defects can be suitably achieved.

(Abrasive)

The material and properties of abrasive contained in the stock polishing solution used in the technology disclosed here are not particularly limited, and can be appropriately selected according to application purposes and use modes. Abrasive may be used alone or two or more thereof may be used in combination. Examples of abrasive include inorganic particles, organic particles, and organic-inorganic composite particles. Specific examples of inorganic particles include silicon compound particles such as silica particles, silicon nitride particles, and silicon carbide particles, and diamond particles. Specific examples of organic particles include polymethyl methacrylate (PMMA) particles and polyacrylonitrile particles. Among these, inorganic particles are preferable.

In the technology disclosed here, examples of particularly preferable abrasive include silica particles. The technology disclosed here can be preferably performed in a mode in which the abrasives are, for example, substantially silica particles. Here, "substantially" means that 95% by weight or more of particles constituting abrasives are silica particles. Preferably 98% by weight or more, and more preferably 99% by weight, for example, 100% by weight, of particles constituting abrasive, may be silica particles.

Specific examples of silica particles include colloidal silica, fumed silica, and precipitated silica. Silica particles can be used alone or two or more thereof can be used in combination. Colloidal silica is particularly preferable because scratches are unlikely to occur on the surface of a polishing object and favorable polishing performance can be exhibited therewith. Regarding colloidal silica, for example, colloidal silica produced using water glass (Na silicate) as a raw material according to an ion exchange method or alkoxide colloidal silica produced according to a hydrolytic condensation reaction of alkoxysilane can be preferably used. Colloidal silicas can be used alone or two or more thereof can be used in combination.

The true specific gravity of silica constituting silica particles is preferably 1.5 or more, more preferably 1.6 or more, and most preferably 1.7 or more. When the true specific gravity of silica increases, the polishing removal rate tends to increase. In this regard, silica particles having a true specific gravity of 2.0 or more, for example, 2.1 or more, are particularly preferable. The upper limit of the true specific gravity of silica is not particularly limited, and is typically, 2.3 or less, for example, 2.2 or less. Regarding the true specific gravity of silica, a value measured using a liquid replacement method using ethanol as a replacement liquid can be used.

When the third polishing solution contains abrasive $A_3$, the average primary particle diameter $D_{A3}$ of the abrasive $A_3$ contained in the third polishing solution is smaller than the average primary particle diameter $D_{A1}$ of the abrasive $A_1$ contained in the first polishing solution and the average primary particle diameter $D_{A2}$ of the abrasive $A_2$ contained in the second polishing solution (that is, $D_{A3}<D_{A1}$ and $D_{A3}<D_{A2}$). When the first polishing solution, the second polishing solution, and the third polishing solution which contain abrasive that satisfy this magnitude relationship between the average primary particle diameters are sequentially used, in the stock polishing step, both improvement in surface flatness and reduction in surface defects can be realized with high efficiency.

The average primary particle diameter $D_{A1}$ of the abrasive $A_1$ contained in the first polishing solution is not particularly limited as long as it is larger than $D_{A3}$ of the abrasive $A_3$. For example, $D_{A1}$ is appropriately about 20 nm or more, and in consideration of polishing removal rate and the like, it is preferably 30 nm or more, more preferably 40 nm or more, and particularly preferably 50 nm or more. In addition, in order to realize a surface with favorable flatness and the like, $D_{A1}$ of the abrasive $A_1$ is preferably 100 nm or less, more preferably 80 nm or less, and most preferably 70 nm or less. In one aspect, $D_{A1}$ of the abrasive $A_1$ may be 65 nm or less, for example, 60 nm or less.

Although not particularly limited, when the third polishing solution contains abrasive $A_3$, the relationship between $D_{A1}$ and $D_{A3}$ is preferably $1<D_{A1}/D_{A3}<3$. The technology disclosed here can be preferably performed in a mode in which, for example, the relationship between $D_{A1}$ and $D_{A3}$ is $1.2 \leq D_{A1}/D_{A3} \leq 2.5$, more preferably $1.4 \leq D_{A1}/D_{A3} \leq 2$, and most preferably $1.5 \leq D_{A1}/D_{A3} \leq 1.8$. $D_{A1}$ is preferably 5 nm or more larger than $D_{A3}$, more preferably 10 nm or more larger than $D_{A3}$, and most preferably 15 nm or more larger than $D_{A3}$. In addition, a value obtained by subtracting $D_{A3}$ from $D_{A1}$ (that is, $D_{A1}-D_{A3}$) is preferably 30 nm or less, more preferably 25 nm or less, and most preferably 22 nm or less.

The average primary particle diameter $D_{A2}$ of the abrasive $A_2$ contained in the second polishing solution is not particularly limited as long as it is larger than $D_{A3}$ of the abrasive $A_3$. For example, $D_{A2}$ is appropriately about 15 nm or more, and in consideration of polishing removal rate and the like, it is preferably 25 nm or more, more preferably 35 nm or more, and particularly preferably 45 nm or more. In addition, in order to easily obtain a surface with higher flatness and the like, $D_{A2}$ of the abrasive $A_2$ is preferably 95 nm or less, more preferably 75 nm or less, and most preferably 65 nm or less. In one aspect, $D_{A2}$ of the abrasive $A_2$ may be 60 nm or less, for example, 55 nm or less. $D_{A2}$ of the abrasive $A_2$ may be the same as or different from $D_{A1}$ of the abrasive $A_1$, and is preferably smaller than $D_{A1}$.

The average primary particle diameter $D_{A3}$ of the abrasive $A_3$ contained in the third polishing solution is not particularly limited as long as the relationship is satisfied between $D_{A1}$ and $D_{A2}$. For example, $D_{A3}$ is appropriately about 5 nm or more, and in consideration of polishing removal rate and the like, it is preferably 10 nm or more, more preferably 20 nm or more, and particularly preferably 30 nm or more. In addition, in order to reduce surface defects more favorably and the like, $D_{A3}$ of the abrasive $A_3$ is preferably 70 nm or less, more preferably 60 nm or less, and most preferably 50 nm or less. In one aspect, $D_{A3}$ of the abrasive $A_3$ may be 45 nm or less, for example, 40 nm or less.

When the third polishing solution does not contain abrasive $A_3$, the average primary particle diameter of the abrasive $A_1$ and the abrasive $A_2$ is not particularly limited. For example, in consideration of polishing removal rate and the like, the average primary particle diameter of the abrasive $A_1$ and the abrasive $A_2$ is preferably 10 nm or more, more preferably 20 nm or more, and particularly preferably 30 nm or more. In addition, in order to easily obtain a surface with higher flatness and the like, the average primary particle diameter of the abrasive $A_1$ and the abrasive $A_2$ is preferably 100 nm or less, more preferably 80 nm or less, and most preferably 70 nm or less. In one aspect, the average primary particle diameter of the abrasive $A_1$ and the abrasive $A_2$ may be 65 nm or less, for example, 60 nm or less.

The average primary particle diameter of the abrasive refers to a particle diameter calculated from a specific surface area (BET value) measured according to a BET method based on the formula of average primary particle diameter (nm)=6,000/((true density (g/cm$^3$)×BET value (m$^2$/g)). For example, in the case of silica particles, the average primary particle diameter can be calculated according to average primary particle diameter (nm)=2,727/BET value (m$^2$/g). The specific surface area can be measured using, for example, a surface area measuring device (product name "FlowSorb II 2300" commercially available from Micromeritics Instrument Corp.).

The shape (outer shape) of the abrasive may be globular, non-globular. Specific examples of non-globular particles include a peanut shape, that is, a peanut shell shape, a cocoon shape, a konpeito shape, and a rugby ball shape. For example, abrasive in which many particles have a peanut shape can be preferably used.

The content of the abrasive in the stock polishing solutions is not particularly limited. In one aspect, the content is preferably 0.01% by weight or more, more preferably 0.05% by weight or more, and most preferably 0.1% by weight or more. The content of the abrasive may be, for example, 0.5% by weight or more, and typically 1% by weight or more. When the content of the abrasive increases, a higher polishing removal rate can be realized. In addition, in consideration of removability from a polishing object and the like, the content is generally appropriately 10% by weight or less, preferably 7% by weight or less, more preferably 5% by weight or less, and most preferably 3% by weight or less, for example, 2% by weight or less.

The technology disclosed here can be preferably performed in a mode in which the relationships between the content $COM_{A1}$ of the abrasive $A_1$ contained in the first polishing solution, the content $COM_{A2}$ of the abrasive $A_2$ contained in the second polishing solution, and the content $COM_{A3}$ of the abrasive $A_3$ contained in the third polishing solution satisfy $COM_{A3}<COM_{A2} \leq COM_{A1}$. It is more preferable to satisfy the relationships of $COM_{A3}<COM_{A2}<COM_{A1}$. When the first polishing solution, the second polishing solution, and the third polishing solution that satisfy these relationships between the contents of such abrasive are sequentially used, in the stock polishing step, improvement in surface flatness and reduction in surface defects can be realized with high efficiency.

In a preferable aspect, the content $COM_{A1}$ of the abrasive $A_1$ contained in the first polishing solution is 0.1% by weight or more. $COM_{A1}$ is preferably 0.3% by weight or more, more preferably 0.5% by weight or more, and most preferably 1% by weight or more. In addition, $COM_{A1}$ is generally appropriately 10% by weight or less, preferably 7% by weight or less, more preferably 5% by weight or less, and most preferably 3% by weight or less, for example, 2% by weight or less.

In a preferable aspect, the content $COM_{A2}$ of the abrasive $A_2$ contained in the second polishing solution is 0.05% by weight or more. $COM_{A2}$ is preferably 0.2% by weight or more, more preferably 0.4% by weight or more, and most preferably 0.8% by weight or more. In addition, $COM_{A2}$ is generally appropriately 8% by weight or less, preferably 6% by weight or less, more preferably 5% by weight or less, and most preferably 3% by weight or less, for example, 1.5% by weight or less.

In a preferable aspect, the content $COM_{A3}$ of the abrasive $A_3$ contained in the third polishing solution is, for example, 0.01% by weight or more. $COM_{A3}$ may be, for example, 0.05% by weight or more, and typically 0.1% by weight or more, for example, 0.2% by weight or more. In addition, $COM_{A3}$ is generally appropriately 5% by weight or less, preferably 3% by weight or less, more preferably 1% by weight or less, and most preferably 0.8% by weight or less. $COM_{A3}$ may be, for example, 0.5% by weight or less, and typically 0.03% by weight or less. In one aspect, the third polishing solution does not contain abrasive $A_3$. The technology disclosed here can be preferably performed in a mode in which the third polishing solution does not substantially contain the abrasive $A_3$.

(Water)

The stock polishing solution typically contains water. Regarding water, ion exchange water (deionized water), pure water, ultrapure water, distilled water, or the like can be preferably used. In water to be used, in order to avoid inhibition of the action of other components contained in the stock polishing solution as much as possible, for example, a total content of transition metal ions is preferably 100 ppb or less. For example, it is possible to increase purity of water by removing impurity ions using an ion exchange resin, foreign substances using a filter, and using a distillation operation or the like.

(Basic compound)

The stock polishing solution preferably contains a basic compound. In this specification, the basic compound refers to a compound that is dissolved in water and having a function of increasing a pH of an aqueous solution. Examples of a basic compound include an organic or inorganic basic compound containing nitrogen, an alkali metal hydroxide, an alkaline earth metal hydroxide, and various carbonates and hydrogencarbonates. Examples of a basic compound containing nitrogen include quaternary ammonium compounds, ammonia, and an amine. The amine is preferably a water-soluble amine. Such basic compounds can be used alone or two or more thereof can be used in combination.

Specific examples of an alkali metal hydroxide include potassium hydroxide and sodium hydroxide. Specific examples of carbonates or hydrogencarbonates include ammonium bicarbonate, ammonium carbonate, potassium bicarbonate, potassium carbonate, sodium hydrogencarbonate, and sodium carbonate. Specific examples of amines include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl)piperazine, N-methylpiperazine, guanidine, and azoles such as imidazole and triazole. Specific examples of a quaternary phosphonium compound include quaternary phosphonium hydroxides such as tetramethylphosphonium hydroxide and tetraethylphosphonium hydroxide.

Regarding the quaternary ammonium compound, a quaternary ammonium salt such as a tetraalkylammonium salt and a hydroxyalkyltrialkylammonium salt can be preferably used. Examples of an anionic component in such a quaternary ammonium salt include $OH^-$, $F^-$, $Cl^-$, $Br^-$, $I^-$, $ClO_4^-$, and $BH_4^-$. Among these, preferable examples thereof include a quaternary ammonium salt in which an anion is $OH^-$, that is, quaternary ammonium hydroxide. Specific examples of quaternary ammonium hydroxides include tetraalkylammonium hydroxides such as tetramethylammonium hydroxide, tetraethylammonium hydroxide, tetrapropylammonium hydroxide, tetrabutylammonium hydroxide, tetrapentylammonium hydroxide and tetrahexyl ammonium hydroxide; and hydroxyalkyltrialkylammonium hydroxides such as 2-hydroxyethyltrimethylammonium hydroxide (called choline), and among these, tetraalkylammonium hydroxides are preferable, and among these, tetramethylammonium hydroxide (TMAH) is preferable.

The stock polishing solution may contain a combination of a quaternary ammonium compound and a weak acid salt as described above. Regarding the weak acid salt, those that can be used for polishing using silica particles and can exhibit a desired buffering action in combination with a quaternary ammonium compound can be appropriately selected. Weak acid salts can be used alone or two or more thereof can be used in combination. Specific examples of weak acid salts include sodium carbonate, potassium carbonate, sodium hydrogencarbonate, potassium bicarbonate, sodium orthosilicate, potassium orthosilicate, sodium acetate, potassium acetate, sodium propionate, potassium propionate, calcium carbonate, calcium bicarbonate, calcium acetate, calcium propionate, magnesium acetate, magnesium propionate, zinc propionate, manganese acetate, and cobalt acetate. A weak acid salt in which an anionic component is a carbonate ion or bicarbonate ion is preferable, and a weak acid salt in which an anionic component is a carbonate ion is particularly preferable. In addition, regarding the cationic component, an alkali metal ion such as potassium and sodium is suitable. Examples of particularly preferable weak acid salts include sodium carbonate, potassium carbonate, sodium hydrogencarbonate, and potassium bicarbonate. Among these, potassium carbonate ($K_2CO_3$) is preferable.

The concentration of the basic compound in the stock polishing solution is not particularly limited. In order to improve a polishing removal rate and the like, generally, the concentration is preferably 0.00001% by weight or more in the polishing solution, and more preferably 0.00005% by weight or more, for example, 0.0001% by weight or more, and typically 0.0002% by weight or more. In addition, in order to reduce the haze and the like, the concentration is appropriately 1% by weight or less, preferably 0.5% by weight or less, and more preferably 0.3% by weight or less.

(Chelating Agent)

The stock polishing solution can contain a chelating agent as an optional component. The chelating agent functions to minimize contamination of a polishing object due to metal impurities by forming complex ions with metal impurities that can be incorporated into the stock polishing solution and capturing them. Examples of chelating agents include an aminocarboxylic acid chelating agent and an organophosphonic acid chelating agent. Examples of aminocarboxylic acid chelating agents include ethylenediaminetetraacetic acid, sodium ethylenediaminetetraacetate, nitrilotriacetic acid, sodium nitrilotriacetate, ammonium nitrilotriacetate, hydroxyethylethylenediaminetriacetic acid, hydroxyethylethylenediamine sodium triacetate, diethylenetriaminepentaacetic acid, sodium diethylenetriaminepentaacetate, triethylenetetraminehexaacetic acid, and sodium triethylenetetramine hexaacetate. Examples of organophosphonic acid chelating agents include 2-aminoethylphosphonic acid, 1-hydroxyethylidene-1,1-diphosphonic acid, aminotri(methylenephosphonic acid), ethylenediaminetetrakis(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid and α-methylphosphonosuccinic acid. Among these, an organophosphonic acid chelating agent is more preferable. Among these, preferable examples thereof include ethylenediaminetetrakis(methylenephosphonic acid), diethylenetriaminepenta(methylenephosphonic acid), and diethylenetriaminepentaacetic acid. Examples of particularly preferable chelating agents include ethylenediaminetetrakis(methylenephosphonic acid) and diethylenetriaminepenta(methylenephosphonic acid). Chelating agents can be used alone or two or more thereof can be used in combination.

(Other Components)

The stock polishing solution may further contain known additives as necessary that can be used in the polishing solution such as a water-soluble polymer, a surfactant, an organic acid, an organic acid salt, an inorganic acid, an inorganic acid salt, an antiseptic agent, and an antifungal agent in a range in which effects of the present invention are not significantly impaired.

The stock polishing solution preferably substantially does not contain an oxidant. This is because, if an oxidant is incorporated into the stock polishing solution, when the stock polishing solution is supplied to a polishing object, the surface of the polishing object is oxidized to form an oxide layer, and thus the polishing removal rate can be reduced. The polishing object is, for example, a silicon substrate. Specific examples of such an oxidant include hydrogen peroxide ($H_2O_2$), sodium persulfate, ammonium persulfate, and sodium dichloroisocyanurate. Here, when it is stated that the stock polishing solution does not substantially contain an oxidant, this means that it contains no oxidant at least intentionally.

(pH)

The pH of the stock polishing solution is typically 8.0 or more, preferably 8.5 or more, more preferably 9.0 or more, most preferably 9.5 or more, for example, 10.0 or more. When the pH of the stock polishing solution increases, the polishing removal rate and bump cancellation tend to be improved. On the other hand, in order to prevent dissolution of abrasive and minimize decrease in the mechanical polishing action due to the abrasive, the pH of the stock polishing solution is appropriately 12.0 or less, preferably 11.8 or less, more preferably 11.5 or less, and most preferably 11.0 or less. The same pH can be preferably used in a final polishing solution to be described below.

Here, in the technology disclosed here, the pH of the liquid composition can be determined by performing 3-point calibration using a pH meter and then putting a glass electrode into a measurement target composition, and measuring a value after stabilization after 2 minutes or longer. The liquid composition may be a polishing solution, a concentrated liquid thereof, a rinse solution to be described below, or the like. The standard buffer solution is, for example, a phthalate pH buffer solution: pH 4.01 (25° C.), a neutral phosphate pH buffer solution: pH 6.86 (25° C.), or a carbonate pH buffer solution: pH 10.01 (25° C.).

<Stock Polishing Step>

As described above, the stock polishing step disclosed here is performed in a mode in which a first stock polishing sub-step in which a polishing object is polished with a first polishing solution, a second stock polishing sub-step in which the polishing object is polished with a second polishing solution, and a third stock polishing sub-step in which the polishing object is polished with a third polishing solution are performed in this order. The polishing object can be generally recognized as a workpiece. When supply of respective polishing solutions starts and ends, a supply amount may be changed gradually or stepwise, or may be changed at one time.

In a preferable aspect, in the stock polishing step, a first polishing solution, a second polishing solution, and a third polishing solution are prepared, and the first polishing solution is supplied to a polishing target substrate, and thus the first stock polishing sub-step starts. After a predetermined time has elapsed from when the first stock polishing sub-step starts, the polishing solution that is supplied is changed from the first polishing solution to the second polishing solution, and the second stock polishing sub-step starts. After a predetermined time has elapsed from when the second stock polishing sub-step starts, the polishing solution that is supplied is changed from the second polishing solution to the third polishing solution, and the third stock polishing sub-step starts. Thereby, a plurality of stock polishing sub-steps can be suitably performed on a same platen.

In another preferable aspect, the second polishing solution includes a mixture containing a first polishing solution and a third polishing solution. The second stock polishing sub-step is performed by simultaneously supplying the first polishing solution and the third polishing solution to a polishing target substrate. In one aspect, a supply timing of the first polishing solution and a supply timing of the third polishing solution partially overlap and the second stock polishing sub-step is performed at this overlapping timing. Typically, in the stock polishing step, the first polishing solution and the third polishing solution are prepared, and the first polishing solution is supplied to a polishing target substrate, and thus the first stock polishing sub-step starts. After a predetermined time has elapsed from when the first stock polishing sub-step starts, the third polishing solution is supplied while supply of the first polishing solution continues, and thus the second stock polishing sub-step starts. After a predetermined time has elapsed from when the second stock polishing sub-step starts, supply of the first polishing solution is stopped while supply of the third polishing solution continues, and thus the third stock polishing sub-step starts. In this manner, when the first polishing solution and the third polishing solution are simultaneously supplied and the second stock polishing sub-step is performed, the polishing method disclosed here can be performed more simply and effectively.

A ratio of a supply rate of the first polishing solution to a supply rate of the third polishing solution (the first polishing solution/the third polishing solution) in the second stock polishing sub-step is not particularly limited. In consideration of polishing removal rate and the like, the supply rate ratio is generally appropriately 2 or more, preferably 3 or more, more preferably 5 or more, and most preferably 8 or more. In order to obtain a flatter surface and the like, the supply rate ratio is generally appropriately 50 or less, preferably 40 or less, more preferably 30 or less, and most preferably 25 or less.

In another aspect, the second polishing solution includes a mixture containing a first polishing solution and a fourth polishing solution. The fourth polishing solution may contain one or two or more of those exemplified as abrasive and water-soluble polymers that can be used in the stock polishing solution. The second stock polishing sub-step is performed by simultaneously supplying the first polishing solution and the fourth polishing solution to a polishing target substrate. Typically, in the stock polishing step, the first polishing solution, the third polishing solution, and the fourth polishing solution are prepared, the first polishing solution is supplied to a polishing target substrate, and thus the first stock polishing sub-step starts. After a predetermined time has elapsed from when the first stock polishing sub-step starts, the fourth polishing solution is supplied while supply of the first polishing solution continues, and thus the second stock polishing sub-step starts. After a predetermined time has elapsed from when the second stock polishing sub-step starts, the polishing solution that is supplied is changed from the first polishing solution and the fourth polishing solution to the third polishing solution, and thus the third stock polishing sub-step starts. The technology disclosed here can be performed in a mode in which the first polishing solution and the fourth polishing solution are simultaneously supplied in this manner, and thus the second stock polishing sub-step is performed.

The polishing time $T_1$ in the first stock polishing sub-step is not particularly limited, and the relationship with the polishing time $T_3$ in the third stock polishing sub-step preferably satisfies $T_3 < T_1$. For example, a ratio of the polishing time $T_1$ in the first stock polishing sub-step to the polishing time $T_3$ in the third stock polishing sub-step, that is, a ratio $T_1/T_3$ of $T_1$ to $T_3$, is generally appropriately 2 or more. In order to shorten a polishing removal time and the like, the ratio $T_1/T_3$ is preferably 3 or more, more preferably 4 or more, and most preferably 5 or more. In addition, the ratio $T_1/T_3$ is generally appropriately 15 or less, preferably 10 or less, and more preferably 8 or less. When the first stock polishing sub-step and the third stock polishing sub-step are performed at such a polishing time ratio, both shortening a polishing removal time and reduction in surface defects can be suitably achieved. The polishing time $T_1$ in the first stock polishing sub-step can be set to, for example, 10 minutes to 30 minutes, and typically 15 minutes to 25 minutes.

The polishing time $T_2$ in the second stock polishing sub-step is not particularly limited, and the relationship with the polishing time $T_1$ in the first stock polishing sub-step preferably satisfies $T_2 < T_1$. For example, a ratio of the polishing time $T_1$ in the first stock polishing sub-step to the polishing time $T_2$ in the second stock polishing sub-step, that is, a ratio $T_1/T_2$ of $T_1$ to $T_2$, is generally appropriately 2 or more. In order to shorten a polishing removal time and the like, the ratio $T_1/T_2$ is preferably 3 or more, more preferably 4 or more, and most preferably 5 or more. In addition, the ratio $T_1/T_2$ is generally appropriately 15 or less, preferably 10 or less, and more preferably 8 or less. When the first stock polishing sub-step and the second stock polishing sub-step are performed at such a polishing time ratio, both shortening a polishing removal time and improvement in surface flatness can be suitably achieved. The polishing time $T_2$ in the second stock polishing sub-step can be set to, for example, 0.3 minutes to 8 minutes, and typically 0.5 minutes to 3 minutes.

The polishing time $T_3$ in the third stock polishing sub-step is not particularly limited. The polishing time $T_3$ in the third stock polishing sub-step may be shorter or longer than the polishing time $T_2$ in the second stock polishing sub-step, and being longer is more preferable. For example, the ratio of the polishing time $T_3$ in the third stock polishing sub-step to the polishing time $T_2$ in the second stock polishing sub-step, that is, the ratio $T_3/T_2$ of $T_3$ to $T_2$, is generally appropriately 0.5 to 3, preferably 0.8 to 2.5, more preferably 0.9 to 2, and most preferably 1 to 2, for example, 1.1 to 1.5. When the second stock polishing sub-step and the third stock polishing sub-step are performed at such a polishing time ratio, improvement in surface flatness and reduction in surface defects can be suitably achieved. The polishing time $T_3$ in the third stock polishing sub-step can be set to, for example, 0.5 minutes to 10 minutes, and typically 1 minute to 5 minutes.

The stock polishing step disclosed here may include, before the first stock polishing sub-step in which a polishing object is polished with a first polishing solution, a stock polishing sub-step Ei that is performed by supplying a polishing solution Ei to the polishing object on a same platen as in the first stock polishing sub-step. Such a stock polishing step can be preferably performed in a mode in which, during polishing of the polishing object, the polishing solution that is supplied to the polishing object is switched from the polishing solution Ei to the first polishing solution. In addition, the stock polishing step disclosed here may include, after the third stock polishing sub-step in which a polishing object is polished with a third polishing solution, a stock polishing sub-step Fi that is performed by supplying a polishing solution Fi to the polishing object on a same platen as in the third stock polishing sub-step. Such a stock polishing step can be preferably performed in a mode in which, during polishing of the polishing object, a polishing solution that is supplied to the polishing object is switched from the third polishing solution to the polishing solution Fi. The stock polishing sub-step Ei and the stock polishing sub-step Fi each may include two or more polishing sub-steps.

In the technology disclosed here, a plurality of stock polishing sub-steps that are performed on a same platen, that is, the number of plurality of stock polishing sub-steps including at least the first stock polishing sub-step, the second stock polishing sub-step, and the third stock polishing sub-step, may be 3 or 4 or more. In order to avoid an excessively complicated stock polishing step, generally, the number of stock polishing sub-steps, is appropriately 6 or less. The stock polishing step including 4 or more stock polishing sub-steps can be preferably performed in a mode in which the first sub-step, the second sub-step, and the third sub-step are first three sub-steps or last three sub-steps.

The stock polishing step may further include one, two or more stock polishing sub-steps that are performed on another platen in addition to the plurality of stock polishing sub-steps that are performed on a same platen. The other platen may be, for example, another platen of a same polishing machine or a platen of another polishing machine.

<Final Polishing Solution>

Typically, the polishing object having undergone the stock polishing step is additionally subjected to a final polishing step. Therefore, the content disclosed in this specification includes a method of polishing a substrate including the stock polishing step in any of the polishing methods disclosed here and the final polishing step performed after the stock polishing step, a method of producing a polished component including application of the polishing method, and a polishing composition set that can be suitably used in the polishing method or the production method.

The final polishing step is generally performed by supplying a final polishing solution to a polishing object using a polishing machine different from that in the stock polishing step. The final polishing step may include a plurality of final polishing sub-steps that are performed on a same platen or different platens.

Typically, the final polishing solution used in the final polishing step includes abrasive and water. Regarding water, water similar to water that can be used in the stock polishing solution can be used.

(Abrasive)

Regarding abrasive for the final polishing solution, silica particles can be preferably used as in the stock polishing solution. Regarding silica particles, colloidal silica is particularly preferable, for example, colloidal silica produced using water glass (silicic acid Na) as a raw material according to an ion exchange method can be preferably used. Colloidal silicas can be used alone or two or more thereof can be used in combination. The preferable true specific gravity of silica particles, and the outer form and average aspect ratio of the abrasive are the same as those in the abrasive of the stock polishing solution and thus redundant description will be omitted.

The average primary particle diameter of the abrasive contained in the final polishing solution is not particularly limited. In consideration of polishing removal rate and the like, the average primary particle diameter is preferably 5 nm or more, and more preferably 10 nm or more. In order to obtain a higher polishing effect, for example, a haze reduction effect and a defect removal effect, the average primary particle diameter is preferably 15 nm or more, and more preferably 20 nm or more, for example, more than 20 nm. In addition, in order to easily obtain a surface with higher smoothness, the average primary particle diameter of the abrasive is preferably 100 nm or less, more preferably 50 nm or less, and most preferably 40 nm or less. In order to easily obtain a surface with higher quality and the like, abrasive having an average primary particle diameter that is 35 nm or less, typically less than 35 nm, preferably less than 32 nm, for example, less than 30 nm, may be used.

The content of the abrasive in the final polishing solution is not particularly limited. In one aspect, the content is preferably 0.01% by weight or more, more preferably 0.03% by weight or more, and most preferably 0.05% by weight or more, and can be, for example, 0.08% by weight or more. When the content of the abrasive increases, a higher polishing effect can be realized. In addition, in consideration of removability from a polishing object and the like, the content of abrasive in the final polishing solution is generally appropriately 7% by weight or less, preferably 5% by weight or less, more preferably 3% by weight or less, and most preferably 2% by weight or less, for example, 1% by weight or less.

(Water-Soluble Polymer)

The final polishing solution preferably contains a water-soluble polymer. Regarding the water-soluble polymer, one or two or more of those exemplified as the water-soluble polymer that can be used in the stock polishing solution can be used.

(Basic Compound)

The final polishing solution preferably contains a basic compound. Regarding the basic compound, one or two or more of those exemplified as the basic compound that can be used in the stock polishing solution can be used.

(Surfactant)

In a preferable aspect, the final polishing solution may contain a surfactant. The surfactant can contribute to improving dispersion stability of the polishing solution or a concentrated liquid thereof. An anionic or nonionic surfactant can be preferably used. In consideration of low foaming properties and ease of pH adjustment, a nonionic surfactant is more preferable. Examples thereof include nonionic surfactants such as oxyalkylene polymers such as polyethylene glycol, polypropylene glycol, and polytetramethylene glycol; polyoxyalkylene adducts such as polyoxyethylene alkyl ether, polyoxyethylene alkylphenyl ether, polyoxyethylene alkylamine, polyoxyethylene fatty acid ester, polyoxyethylene glyceryl ether fatty acid ester, and polyoxyethylene sorbitan fatty acid ester; and copolymers of a plurality of types of oxyalkylene. Examples of copolymers of a plurality of types of oxyalkylene include a diblock copolymer, a triblock copolymer, a random copolymer, and an alternating copolymer. Surfactants can be used alone or two or more thereof can be used in combination.

Mw of the surfactant is typically less than $1\times10^4$, and in consideration of filterability of the polishing solution, cleanability of a polishing object, and the like, it is preferably 9,500 or less. In addition, Mw of the surfactant is typically 200 or more, and in consideration of a haze reducing effect and the like, it is preferably 250 or more, and more preferably 300 or more, for example, 500 or more. Regarding Mw of the surfactant, a value determined through GPC (aqueous, in terms of polyethylene glycol) or a value calculated from a chemical formula can be used. Here, the technology disclosed here can be performed in a mode in which the final polishing solution that substantially does not contain a surfactant as described above is used.

(Other Components)

The final polishing solution may further contain known additives as necessary that can be used in the polishing solution such as a chelating agent, an organic acid, an organic acid salt, an inorganic acid, an inorganic acid salt, an antiseptic agent, and an antifungal agent in a range in which effects of the present invention are not significantly impaired. Regarding the chelating agent, the same chelating agent that can be used in the stock polishing solution can be used. The technology disclosed here can be performed in a mode in which a final polishing solution that substantially does not contain a chelating agent is used.

Here, preferably, the final polishing solution substantially does not contain an oxidant as in the stock polishing solution.

<Polishing>

Polishing in the stock polishing step and the final polishing step can be performed in a mode including, for example, the following operations.

That is, a polishing solution used in each polishing step or each polishing sub-step is prepared. Next, the polishing solution (for example, working slurry) is supplied to the polishing object and polishing is performed according to a conventional method. For example, the polishing object is set in a polishing machine, and the polishing solution is supplied to the surface (surface to be polished) of the polishing object through a polishing pad fixed to a platen (polishing platen) of the polishing machine. Typically, while the polishing solution is continuously supplied, the polishing pad is pressed against the surface of the polishing object, and both are relatively moved (for example, rotationally moved).

Each polishing solution may be in a concentrated form before it is supplied to the polishing object. The concentrated form is a form of a concentrated liquid of the polishing solution, and can be understood as a stock solution for the polishing solution. The polishing solution in such a concentrated form is advantageous in consideration of convenience, cost reduction, and the like during production, distribution, storage, and the like. The concentration factor is not particularly limited, and can be, for example, about 2 to 100 in terms of volume, and generally about 5 to 50, and appropriately, for example, about 10 to 40.

Such a concentrated liquid can be used in a mode in which a polishing solution is prepared by performing dilution at a desired timing, and the polishing solution is supplied to a polishing object. The dilution can be performed, for example, by adding water to the concentrated liquid and mixing.

The content of abrasive in the concentrated liquid can be, for example, 50% by weight or less. In consideration of handleability of the concentrated liquid, for example, dispersion stability and filterability of abrasive, generally, the content of abrasive in the concentrated liquid is preferably 45% by weight or less, and more preferably 40% by weight or less. In addition, in consideration of convenience, cost reduction, and the like during production, distribution, storage, and the like, the content of abrasive can be, for example, 0.5% by weight or more, and is preferably 1% by weight or more, and more preferably 3% by weight or more, for example, 4% by weight or more. In a preferable aspect, the content of abrasive may be 5% by weight or more, 10% by weight or more, for example, 15% by weight or more, 20% by weight or more, or 30% by weight or more.

The polishing solution or a concentrated liquid thereof used in the technology disclosed here may be of a one-agent type or a multi-agent type including a two-agent type. For example, a part A containing at least abrasive and a part B containing any remaining components among components constituting the polishing solution are mixed, and as necessary, diluted at an appropriate timing to prepare a polishing solution may be used.

A method of preparing a polishing solution or a concentrated liquid thereof is not particularly limited. Respective components contained in the polishing solution or a concentrated liquid thereof may be mixed using, for example, a well-known mixing device such as a blade type stirrer, an ultrasonic dispersing machine, and a homo mixer. A mode in which such components are mixed is not particularly limited, and for example, all components may be mixed at once or may be mixed according to an appropriately set order.

In the polishing steps or polishing sub-steps, the polishing solution may be used in a disposable manner (so-called "one-way") in which it is discarded after used once for polishing or may be used in recycle. Regarding an example of a method of circulating and using a polishing solution, a method of collecting a used polishing solution discharged from a polishing machine in a tank and supplying the collected polishing solution to the polishing machine again may be exemplified.

The polishing pad used in each platen is not particularly limited. For example, polishing pads of a polyurethane foam type, a non-woven type, a suede type, and the like can be used. Each polishing pad may include abrasive or may not include abrasive.

Regarding the polishing machine, a double-side polishing machine that simultaneously polishes both surfaces of a polishing object may be used, or a single-side polishing machine that polishes only one surface of a polishing object may be used. Although not particularly limited, for example, in the stock polishing step, a double-side polishing machine, for example, a batch type double-side polishing machine, can be preferably used. In addition, in the final polishing step, a single-side polishing machine can be preferably used. The number of platens included in each polishing machine may be 1 or 2 or more. Each polishing machine may be a single-wafer type polishing machine that is configured to polish one polishing object at a time or a batch type polishing machine that can simultaneously polish a plurality of polishing objects on a same platen.

Although not particularly limited, in the plurality of stock polishing sub-steps that are performed on a same platen, in consideration of polishing removal rate and the like, a supply rate of the polishing solution to the platen is generally appropriately 0.3 L/min or more, preferably 0.5 L/min or more, more preferably 1 L/min or more, for example, 2 L/min or more. In addition, in consideration of economic efficiency, environmental load reduction, and the like, a supply flow rate of the polishing solution to the platen is generally appropriately 15 L/min or less, and more preferably 10 L/min or less, for example, 7 L/min or less.

In one aspect, regarding a supply flow rate of the polishing solution per total area of about 0.71 $m^2$ of the surface to be polished, the supply flow rate described above can be preferably applied. A supply flow rate of the polishing solution per total area of about 0.71 $m^2$ of the surface to be polished can be appropriately increased or decreased according to the total area of the surface to be polished that is actually polished so that the supply flow rate per total area is maintained at substantially the same level.

The polishing object having undergone the stock polishing step is typically cleaned before the final polishing step starts. This cleaning can be performed using an appropriate cleaning solution. The cleaning solution to be used is not particularly limited, for example, a general SC-1 cleaning solution, SC-2 cleaning solution, and the like in the field of semiconductors can be used. Examples of SC-1 cleaning solutions include a solution in which ammonium hydroxide ($NH_4OH$), hydrogen peroxide ($H_2O_2$), and water ($H_2O$) are mixed. Examples of SC-2 cleaning solutions include a solution in which hydrogen chloride (HCl), $H_2O_2$, and $H_2O$ are mixed. The temperature of the cleaning solution can be, for example, room temperature, and typically about 15° C. to 25° C. or higher, and in a range up to about 90° C. In order to improve a cleaning effect, a cleaning solution of about 50° C. to 85° C. can be preferably used. Here, the polishing object having undergone the final polishing step can be cleaned in the same manner. Typically, this cleaning is performed outside a polishing machine used in the stock polishing step, that is, after the polishing object is removed from the polishing machine.

According to the polishing method disclosed here, through the stock polishing step and the subsequent final polishing step as described above, polishing of the polishing object is completed. Therefore, regarding another aspect of the technology disclosed here, there is provided a method of producing a polished component including polishing of the polishing object by applying any of polishing methods disclosed here.

<Polishing Composition Set>

According to this specification, a polishing composition set that can be suitably used in the polishing method disclosed here is provided. The polishing composition set includes at least a first stock polishing composition and a third stock polishing composition that are stored separately from each other. The first stock polishing composition may be the first polishing solution or a concentrated liquid thereof. The third stock polishing composition may be the third polishing solution or a concentrated liquid thereof.

In addition, in one aspect, a second stock polishing composition that is the second polishing solution or a concentrated liquid thereof is further included. The second stock polishing composition is stored separately from the first stock polishing composition and the third stock polishing composition.

The polishing method disclosed here can be suitably performed using such a polishing composition set. Therefore, the polishing composition set can be preferably used for the polishing method disclosed here, a polished component production method including performing the polishing method, and the like. The polishing compositions that constitute a polishing composition set each may be of a one-agent type or a multi-agent type including a two-agent type. For example, the multi-agent type polishing composition is stored separately as a part A containing at least abrasive and a part B containing any remaining components among components constituting each polishing composition, the part A and the part B are mixed, and as necessary, diluted at an appropriate timing to prepare a polishing composition or a polishing solution.

EXAMPLES

Several examples related to the present invention will be described below, and this is not intended to limit the present invention to that described in such examples. Here, "%" in the following description is based on the weight unless otherwise specified.

1. Preparation of Polishing Solution (Composition A)

Colloidal silica, tetramethylammonium hydroxide (TMAH), potassium carbonate and ion exchange water were mixed to prepare a composition A including colloidal silica having a content of 1.2% by weight, TMAH having a content of 0.086% by weight, and $K_2CO_3$ having a content of 0.037% by weight.

(Composition B)

Colloidal silica, ammonia, hydroxyethyl cellulose (HEC: Mw 1,200,000), and ion exchange water were mixed to prepare a composition B including colloidal silica having a content of 0.5% by weight, ammonia having a content of 0.01% by weight, and HEC having a content of 0.012% by weight.

(Composition C)

Colloidal silica, TMAH, potassium carbonate, PVP (Mw 45,000) and ion exchange water were mixed to prepare a composition C including colloidal silica having a content of 1.2% by weight, TMAH having a content of 0.086% by weight, potassium carbonate having a content of 0.037% by weight, and PVP having a content of 0.0012% by weight.

(Composition D)

PVP (Mw 45,000) and ion exchange water were mixed to prepare a composition D including PVP having a content of 0.0121% by weight.

(Composition E)

Polyvinyl alcohol (PVA: Mw 13,000) and ion exchange water were mixed to prepare a composition E including PVA having a content of 0.00403% by weight.

(Composition F)

Ammonia, HEC and ion exchange water were mixed to prepare a composition F including ammonia having a content of 0.00037% by weight and HEC having a content of 0.012% by weight.

(Composition G)

Colloidal silica, ammonia, hydroxyethyl cellulose (HEC: Mw 1,200,000), and ion exchange water were mixed to prepare a composition G including colloidal silica having a content of 0.5% by weight, ammonia having a content of 0.01% by weight, and HEC having a content of 0.006% by weight.

(Composition H)

Colloidal silica, TMAH, potassium carbonate, PVP (Mw 45,000), and ion exchange water were mixed to prepare a composition H including colloidal silica having a content of 1.2% by weight, TMAH having a content of 0.086% by weight, potassium carbonate having a content of 0.037% by weight, and PVP having a content of 0.012% by weight.

Here, the pH of each of the compositions A to H may be adjusted to 10 or more and 11 or less. The average primary particle diameter and content of abrasive used in each composition, the content of the basic compound, and the content of the water-soluble polymer are shown in Table 1. The average primary particle diameter of abrasive was determined using a surface area measuring device (product name "FlowSorb II 2300" commercially available from Micromeritics Instrument Corp.).

[Table 1]

TABLE 1

| Composition | Abrasive Colloidal silica | | Basic compound | | | Water-soluble polymer | | |
|---|---|---|---|---|---|---|---|---|
| | Average primary particle diameter (nm) | Content (%) | Ammonia Content (%) | TMAH Content (%) | Potassium carbonate Content (%) | HEC Content (%) | PVA Content (%) | PVP Content (%) |
| A | 55.0 | 1.2 | — | 0.086 | 0.037 | — | — | — |
| B | 35.0 | 0.5 | 0.010 | — | — | 0.012 | — | — |
| C | 55.0 | 1.2 | — | 0.086 | 0.037 | — | — | 0.0012 |
| D | — | — | — | — | — | — | — | 0.012 |
| E | — | — | — | — | — | — | 0.0040 | — |
| F | — | — | 0.00037 | — | — | 0.012 | — | — |
| G | 35.0 | 0.5 | 0.010 | — | — | 0.006 | — | — |
| H | 55.0 | 1.2 | — | 0.086 | 0.037 | — | — | 0.012 |

2. Polishing of Silicon Wafer

Examples 1 to 8

Using polishing solutions containing compositions A to H alone or mixed in combinations, the stock polishing step including stock polishing sub-steps shown in Table 2 was performed. Regarding a polishing object (test piece), a commercial silicon single crystal wafer (thickness: 785 μm, conduction type: P type, crystal orientation: <100>, resistivity: 1 Ω·cm or more and less than 100 Ω·cm) with a diameter of 300 mm subjected to lapping and etching was used.

Specifically, the stock polishing step as performed as follows. That is, five test pieces (a total area of a surface to be polished; about 0.71 m$^2$) were set in the following double-side polishing machine, and the first polishing solution was supplied to start the first stock polishing sub-step. After 18 minutes has elapsed from when the first stock polishing sub-step started, the polishing solution that was supplied was changed to the second polishing solution to start the second stock polishing sub-step. After 2.3 minutes has elapsed from when the second stock polishing sub-step started, the polishing solution that was supplied was changed to the third polishing solution to start the third stock polishing sub-step. After 3 minutes has elapsed from when the third stock polishing sub-step started, supply of the third polishing solution and the operation of the double-side polishing machine were stopped.

[Stock Polishing Condition]
Polishing machine: double-side polishing machine (model number "DSM20B-5P-4D" commercially available from SpeedFam Co., Ltd.)
Polishing pressure: 150 g/cm$^2$
Upper platen relative rotational speed: 20 rpm
Lower platen relative rotational speed: −20 rpm
Polishing pad: product name "MH-S15A" (commercially available from Nitta Haas Inc.)
Processing carrier: double-sided DLC-coated carrier, average thickness of 776 microns
Holding temperature of polishing environment: 23° C.

(Cleaning)

The test piece after stock polishing was removed from the polishing machine, and cleaned with a cleaning solution containing NH$_4$OH (29%):H$_2$O$_2$ (31%):deionized water (DIW)=1:3:30 (volume ratio) (SC-1 washing). More specifically, two cleaning tanks including an ultrasonic wave oscillator having a frequency of 950 kHz were prepared, the cleaning solution was stored in each of the first and second cleaning tanks and remained at 60° C., the test piece after stock polishing was immersed in the first cleaning tank for 6 minutes, and then passed through an ultrapure water and ultrasonic rinsing tank, and immersed in the second cleaning tank for 6 minutes while the ultrasonic wave oscillator was operated.

Comparative Examples 1 to 8

In these examples, using polishing solutions containing compositions A to H alone or mixed in combinations, the stock polishing step including two stock polishing sub-steps shown in Table 2 was performed. That is, the first polishing solution was supplied to start the first stock polishing sub-step. After a predetermined time had elapsed from when the first stock polishing sub-step started, the polishing solution that was supplied was changed to the second polishing solution to start the second stock polishing sub-step. After a predetermined time had elapsed from when the second stock polishing sub-step started, supply of the second polishing solution and the operation of the double-side polishing machine were stopped. Regarding other parts, the stock polishing step of the silicon wafer was performed in the same manner as in Examples 1 to 8.

3. Evaluation
<Calculation of Polishing Removal Time>

The average thickness of the test piece before and after polishing was performed under the above conditions was measured using a flatness measuring device "NANOMETRO 300TT" (commercially available from Kuroda Precision Industries Ltd.), and the thickness (polishing removal) reduced due to polishing was calculated.

When the polishing removal was not 10 μm, the polishing removal time was changed from the above polishing conditions, and a polishing removal time at which the polishing removal was 10 μm was determined and recorded as a polishing removal time [min]. Here, a sum of the polishing removal time in the first stock polishing sub-step, the polishing removal time in the second stock polishing sub-step, and a polishing removal time in the third stock polishing sub-step was calculated as a polishing removal time.

<Number of Defects>

Regarding the silicon wafers (the test pieces subjected to the stock polishing step and the subsequent cleaning) obtained in the examples, the entire surface of the wafers was examined using "Surfscan SP2$^{XP}$" (commercially available from KLA Corporation) and the number of defects with a size of 0.2 microns or more was counted. The number of defects obtained was evaluated according to the following four levels. The results are shown in the column "number of defects" in Table 2.
4: 10 or less
3: more than 10 and 20 or less
2: more than 20 and 30 or less
1: more than 30

<Flatness (GBIR)>

Using a flatness measuring device "NANOMETRO 300TT" (commercially available from Kuroda Precision Industries Ltd.), GBIR (edge exclusion area of 2 mm) was measured according to SEMI standards. The obtained measured values were evaluated according to the following three levels.
3: 200 nm or less
2: more than 200 nm and 300 nm or less
1: more than 300 nm The polishing removal time, number of defects, and flatness evaluation results are shown in Table 2. Table 2 shows the composition, supply flow rate, and polishing removal time used in the stock polishing sub-steps and the value of the content of the water-soluble polymer (polymer) in the second stock polishing sub-step together.

TABLE 2

| | Stock polishing process | | | | | | | | | Required polishing | Polishing result | |
|---|---|---|---|---|---|---|---|---|---|---|---|---|
| | First stock polishing step | | | Second stock polishing step | | | | Third stock polishing step | | | | |
| | First polishing solution | Flow rate (L/Min) | Time (min) | Second polishing solution | Flow rate (L/min) | Polymer content (%) | Time (min) | Third polishing solution | Flow rate (L/min) | Time (min) | time (min) | Flatness | Number of defects |
| Example 1 | A | 4 | 18 | A<br>D | 3.6<br>0.4 | 0.0012 | 2.3 | D | 2 | 3.0 | 23.3 | 3 | 3 |

TABLE 2-continued

| | Stock polishing process | | | | | | | | | | | |
|---|---|---|---|---|---|---|---|---|---|---|---|---|
| | First stock polishing step | | | Second stock polishing step | | | | Third stock polishing step | | | Required | Polishing result |
| | First polishing solution | Flow rate (L/Min) | Time (min) | Second polishing solution | Flow rate (L/min) | Polymer content (%) | Time (min) | Third polishing solution | Flow rate (L/min) | Time (min) | polishing time (min) | Flatness / Number of defects |
| Example 2 | A | 4 | 18 | A / E | 3.6 / 0.4 | 0.00040 | 2.3 | E | 2 | 3.0 | 23.3 | 3 / 3 |
| Example 3 | A | 4 | 18 | A / F | 3.8 / 0.2 | 0.00060 | 2.3 | F | 2 | 3.0 | 23.3 | 3 / 3 |
| Example 4 | A | 4 | 18 | A / D | 3.6 / 0.4 | 0.0012 | 2.3 | F | 2 | 3.0 | 23.3 | 3 / 3 |
| Example 5 | A | 4 | 18 | A / D | 3.6 / 0.4 | 0.0012 | 2.3 | B | 2 | 3.0 | 23.3 | 3 / 4 |
| Example 6 | A | 4 | 18 | A / B | 3.8 / 0.2 | 0.00060 | 2.3 | B | 2 | 3.0 | 23.3 | 3 / 4 |
| Example 7 | A | 4 | 18 | C | 4 | 0.0012 | 2.3 | D | 2 | 3.0 | 23.3 | 3 / 4 |
| Example 8 | A / D | 3.8 / 0.2 | 19 | A / D | 3.6 / 0.4 | 0.0012 | 1.8 | D | 2 | 2.5 | 23.3 | 3 / 3 |
| Comparative example 1 | A | 4 | 20 | B | 2 | 0.012 | 3 | — | — | — | 23 | 1 / 4 |
| Comparative example 2 | C | 4 | 23.2 | B | 2 | 0.012 | 3 | — | — | — | 26.2 | 3 / 4 |
| Comparative example 3 | A | 4 | 18 | A / D | 3.6 / 0.4 | 0.0012 | 2.3 | — | — | — | 20.3 | 3 / 2 |
| Comparative example 4 | A | 4 | 18 | C | 4 | 0.0012 | 2.3 | — | — | — | 20.3 | 3 / 2 |
| Comparative example 5 | A / D | 3.6 / 0.4 | 21 | A / D | 3.8 / 0.2 | 0.00061 | 1.8 | D | 2 | 2.5 | 25.3 | 3 / 3 |
| Comparative example 6 | A / D | 3.6 / 0.4 | 21 | H / D | 3.8 / 0.2 | 0.012 | 1.8 | B / D | 3.8 / 0.2 | 2.5 | 25.3 | 3 / 3 |
| Comparative example 7 | A / D | 3.6 / 0.4 | 21 | G | 2 | 0.006 | 3.5 | H / D | 3.8 / 0.2 | 2.5 | 27 | 2 / 1 |
| Comparative example 8 | A / D | 3.8 / 0.2 | 19 | B | 2 | 0.012 | 3 | A / D | 3.8 / 0.2 | 1.8 | 23.8 | 2 / 1 |

As shown in Table 1 and Table 2, in Examples 1 to 4, 7 and 8, the relationships between the content $COM_{P1}$ of the water-soluble polymer contained in the first polishing solution, the content $COM_{P2}$ of the water-soluble polymer $P_2$ contained in the second polishing solution, and the content $COM_{P3}$ of the water-soluble polymer $P_3$ contained in the third polishing solution satisfied $COM_{P1} < COM_{P2} < COM_{P3}$, and the third polishing solution did not contain abrasive. In addition, in Examples 5 and 6, $COM_{P1} < COM_{P2} < COM_{P3}$ was satisfied, and the average primary particle diameter $D_{A3}$ of the abrasive $A_3$ contained in the third polishing solution was smaller than the average primary particle diameter $D_{A1}$ of the abrasive $A_1$ contained in the first polishing solution and the average primary particle diameter $D_{A2}$ of the abrasive $A_2$ contained in the second polishing solution. In Examples 1 to 8 in which the stock polishing step including three stock polishing sub-steps was performed, high quality surfaces having a short polishing removal time, higher flatness and fewer defects were obtained with high efficiency. On the other hand, in all of Comparative examples 1 to 4 in which the stock polishing step including two stock polishing sub-steps was performed, it was confirmed that the balance between improvement in flatness, reduction in surface defects, and shortening a polishing removal time was insufficient. In addition, in Comparative examples 5 and 6, the relationships between the content $COM_{P1}$ of the water-soluble polymer contained in the first polishing solution, the content $COM_{P2}$ of the water-soluble polymer $P_2$ contained in the second polishing solution, and the content $COM_{P3}$ of the water-soluble polymer $P_3$ contained in the third polishing solution did not satisfy $COM_{P1} < COM_{P2} < COM_{P3}$. In Comparative example 7, the average primary particle diameter $D_{A3}$ of the abrasive $A_3$ contained in the third polishing solution was larger than the average primary particle diameter $D_{A3}$ of the abrasive $A_1$ contained in the first polishing solution and the average primary particle diameter $D_{A2}$ of the abrasive $A_2$ contained in the second polishing solution. In Comparative example 8, neither the content of the water-soluble polymer nor the average primary particle diameter of the abrasive satisfied the above preferable conditions. In all of Comparative examples 5 to 8, it was confirmed that the balance between improvement in flatness, reduction in surface defects, and shortening a polishing removal time was insufficient.

While specific examples of the present invention have been described above in detail, these are only examples and do not limit the scope of the claims. The technology described in the claims include various modifications and changes of the specific examples exemplified above.

The invention claimed is:

1. A method of polishing a substrate, comprising:
a stock polishing step of preliminarily polishing the substrate, wherein
the stock polishing step includes a plurality of stock polishing sub-steps that are performed on a same polishing platen, wherein
the plurality of stock polishing sub-steps include a first stock polishing sub-step that is performed by supplying a first polishing solution, a second stock polishing sub-step that is performed by supplying a second polishing solution, and a third stock polishing sub-step that is performed by supplying a third polishing solution, to the substrate, in this order, wherein the relationships between a content $COM_{P1}$ of a water-soluble polymer $P_1$ contained in the first polishing solution, a content $COM_{P2}$ of a water-soluble polymer $P_2$ contained in the second polishing solution, and a content $COM_{P3}$ of a water-soluble polymer $P_3$ contained in the third polishing solution satisfy $COM_{P1}<COM_{P2}<COM_{P3}$ and any one of the following conditions is satisfied:

(1) the average primary particle diameter $D_{A3}$ of abrasive $A_3$ contained in the third polishing solution is smaller than the average primary particle diameter $D_{A1}$ of abrasive $A_1$ contained in the first polishing solution and the average primary particle diameter $D_{A2}$ of abrasive $A_2$ contained in the second polishing solution; and (2) the third polishing solution does not contain abrasive $A_3$, wherein the second polishing solution is a mixture containing the first polishing solution and the third polishing solution; and wherein the second stock polishing sub-step is performed by simultaneously supplying the first polishing solution and the third polishing solution to the substrate.

2. The polishing method according to claim 1, wherein the first polishing solution does not contain the water-soluble polymer $P_1$.

3. The polishing method according to claim 1, wherein the stock polishing step is performed on a silicon substrate.

* * * * *